United States Patent [19]
Mita et al.

[11] Patent Number: 4,682,115
[45] Date of Patent: Jul. 21, 1987

[54] APPARATUS FOR REGENERATING ORIGINAL SIGNALS

[75] Inventors: Seiichi Mita, Tsukui; Morishi Izumita, Inagi; Yuichi Michikawa, Katsuta; Hitoshi Katayama, Nerima; Hiroshi Shiono, Mito; Hitoshi Takagi; Morito Rokuda, both of Katsuta; Nobukazu Doi, Kokubunji, all of Japan

[73] Assignee: Hitachi, Ltd., Tokyo, Japan

[21] Appl. No.: 742,792

[22] Filed: Jun. 10, 1985

[30] Foreign Application Priority Data

Jun. 11, 1984 [JP] Japan .................................. 59-119487

[51] Int. Cl.$^4$ .......................... H03K 5/00; H03K 5/01
[52] U.S. Cl. ................................... 328/164; 328/163; 328/167; 307/261; 307/268
[58] Field of Search ............... 328/163, 164, 165, 167; 307/260, 261, 268; 455/304, 305, 306; 178/69 M; 375/4; 365/65–66

[56] References Cited

U.S. PATENT DOCUMENTS

| 3,602,737 | 8/1971 | Radecke | 328/167 |
| 3,652,872 | 3/1972 | Miller | 328/167 |
| 4,238,744 | 12/1980 | Iwahara | 328/165 |
| 4,460,871 | 7/1984 | Orban | 328/163 |

OTHER PUBLICATIONS

IEEE Transaction on Communication, vol. Com 22, No. 1, Jan. 1974, "Quantized Feedback in an Experimental 280-Mb/S Digital Repeater for Coaxial Transmission", F. D. Waldhauer.

Primary Examiner—Stanely D. Miller
Assistant Examiner—Trong Quang Phan
Attorney, Agent, or Firm—Antonelli, Terry & Wands

[57] ABSTRACT

An apparatus for regenerating original signals comprising: means for introducing a first signal that is produced as an original signal passes through a system that cuts off predetermined frequencies; a first circuit means which produces a third signal obtained on an open loop responsive to said first signal and a second signal which is regenerated from a signal of a predetermined frequency that is cut off by said system; and a second circuit means which regenerates the original signal by converting said third signal into a binary signal.

6 Claims, 6 Drawing Figures

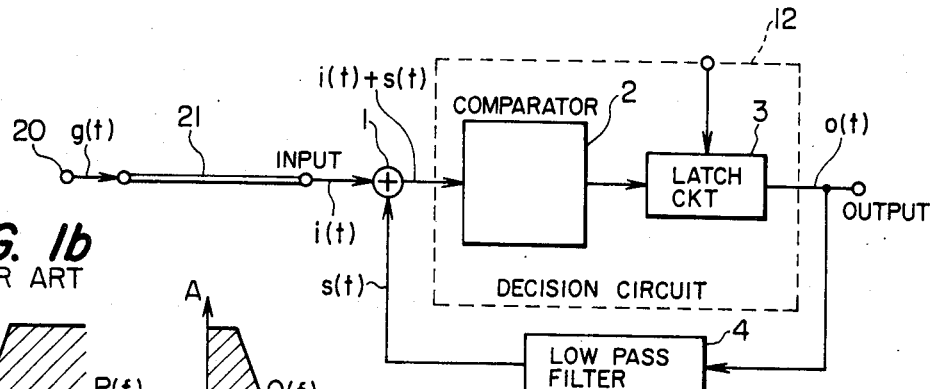
FIG. 1a PRIOR ART
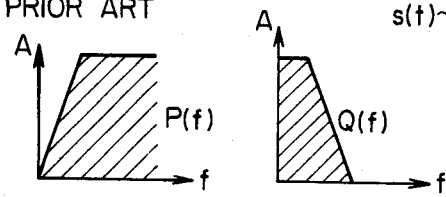
FIG. 1b PRIOR ART
FIG. 1c PRIOR ART
FIG. 2 PRIOR ART
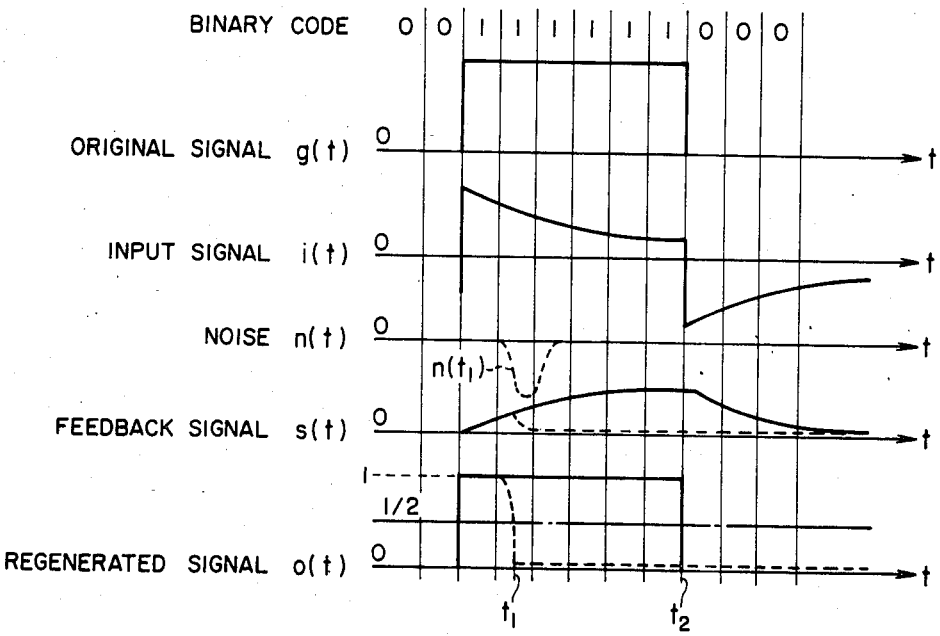

APPARATUS FOR REGENERATING ORIGINAL SIGNALS

BACKGROUND OF THE INVENTION

The present invention relates to an apparatus for regenerating original signals, and particularly to an apparatus for regenerating original signals while compensating missing portions that develop in the waveforms when digital signals are to be recorded, regenerated or transmitted.

Digital signals that are to be recorded or regenerated by a VTR (video tape recorder) have to be transmitted or received via a transformer, resulting in a cut-off in the low-frequency band. Further, when the signals are transmitted and received via a circuit having resistance R and capacity C, such as a telephone circuit, the signal amplitude is attenuated due to the transient phenomenon CR. Therefore, cut-off takes place not only in the low-frequency band, but also in the high-frequency band as well as in the intermediate-frequency band. Among the digital signals, furthermore, codes of the NRZ series develop a conspicuous sag in amplitude to the cut-off of low frequencies, often making it difficult to distinguish "1" from "0".

It is therefore necessary to regenerate original signals while compensating missing portions in the waveforms. For this purpose, there has been proposed a method which is based upon the quantized feedback (e.g., IEEE TRANSACTIONS ON COMMUNICATIONS, VOL. COM 22, No. 1, JANUARY 1974, "Quantized Feedback in an Experimental 280-Mb/s Digital Repeater for Coaxial Transmission", F.D. WALDHAUER).

Construction and operation of the above method are briefly described below with reference to FIGS. 1 and 2.

The quantized feedback method consists, as shown in FIG. 1(a), of a decision circuit 12 made up of a comparator 2 and a latch circuit 3, a feedback circuit having a lowpass filter 4, and an adder 1. It is now presumed that an original signal g(t) generated from a signal source 20 passes through a system 21 which cuts off a predetermined frequency. This system may be, for instance, a recording/ regenerating system or a transmission system. It is presumed that this system has low-frequency cut-off characteristics P(f), and the signal which has passed through this system is regarded to be an input signal i(t). The fundamental operation of the quantized feedback method is to regenerate, from a signal 0(t) produced by the decision circuit 12, a signal s(t) of low-frequency component lost through the recording-/regenerating system 21. That is, the decision circuit 12 consisting of comparator 2 and latch circuit 3 determines the output i(t) +s(t) of the adder 1 to be "1" or "0", and produces a signal 0(t) similar to the original signal g(t). The signal 0(t) is then passed through a low-pass filter 4 to extract the signal s(t) of a predetermined low-frequency component. If the filter 4 has transmission characteristics Q(f) as shown in FIG. 1(c) which has the following relation, $$Q(f) + P(f) = 1 \qquad (1)$$

and if the error rate of signal 0(t) after having been determined is sufficiently small, the filter 4 regenerates output s(t) which corresponds to the original low-frequency component. The thus regenerated low-frequency signal s(t) is added to the input signal i(t) through the adder 1 to regenerate the signal 0(t) which is similar to the original signal g(t).

FIG. 2 shows signal waveforms at each of the above-mentioned portions.

According to the above quantized feedback method, however, any error that occurs in the code may undergo chain propagation and may not be corrected. The reason is attributed to a positive feedback loop that is formed in the circuit by the comparator 2 and filter 4 as is obvious from the construction of FIG. 1(a). Described below is the condition where error in the code undergoes chain propagation. Here, the amplitude of the signal produced by the adder 1 is standardized to 1.

It is presumed that $i(t_1) + s(t_1) > \frac{1}{2}$ at a moment $t_1$ in FIG. 2. At this moment, it is further assumed that noise $n(t_1)$ is added to the signal $i(t_1)$ or $s(t_1)$, and the signal produced by the adder 1 becomes smaller than the decision level $\frac{1}{2}$. Namely if $i(t_1) + s(t_1) + n(t_1) < \frac{1}{2}$, the output 0(t) of the decision circuit 12 changes from "1" to "0" at the moment $t_1$, and the code error continues up to a moment $t_2$ at which the output 0(t) should have changed to "0". The same also holds true even when an error causes the signal level to change from "0" to "1". Such a phenomenon occurs even when the amplitude of the input signal i(t) is changed for some reason. That is, under the condition where $i(t_1) + s(t_1) > \frac{1}{2}$, the signal $s(t_1)$ may change to $s'(t_1)$ so that $i(t_1) + s'(t_1) < \frac{1}{2}$. Then, the output signal 0(t) of the decision circuit 12 changes from "1" to "0", and an error occurs in the code as in the above-mentioned case.

SUMMARY OF THE INVENTION

In order to improve the aforementioned defects inherent in the prior art, the present invention provides an apparatus which regenerates original signals by compensating waveforms of digital signals deteriorated in a system in which predetermined frequencies are cut off, without permitting code error to continue.

In order to achieve the above-mentioned object, the apparatus of the present invention comprises:

means for introducing a first signal that is produced as an original signal passes through a system that cuts off predetermined frequencies;

a first circuit means which produces a third signal obtained on an open loop responsive to said first signal and a second signal which is regenerated from a signal of a predetermined frequency that is cut off by said system; and a second circuit means which regenerates the original signal by converting said third signal into a binary signal.

Here, the first circuit means is so constructed as to produce the third signal which corresponds to the signal i(t) +s(t) of FIG. 1 relying upon an open loop instead of a feedback loop, and can hence prevent code error from continuing.

BRIEF DESCRIPTION OF THE DRAWINGS

FIGS. 1(a)–(c) are diagrams showing the construction of a conventional apparatus for regenerating original signals by the quantized feedback;

FIG. 2 is a diagram showing waveforms of signals at each of the portions of FIG. 1;

FIGS. 5(a)-(c) are diagrams showing the change in the crest value of pulse responsive to the change in the low cut-off frequency characteristics.

DETAILED DESCRIPTION OF THE PREFERRED EMBODIMENTS

FIG. 3 is a diagram showing the construction of an apparatus for regenerating original signals according to an embodiment of the present invention.

Figure 3A:
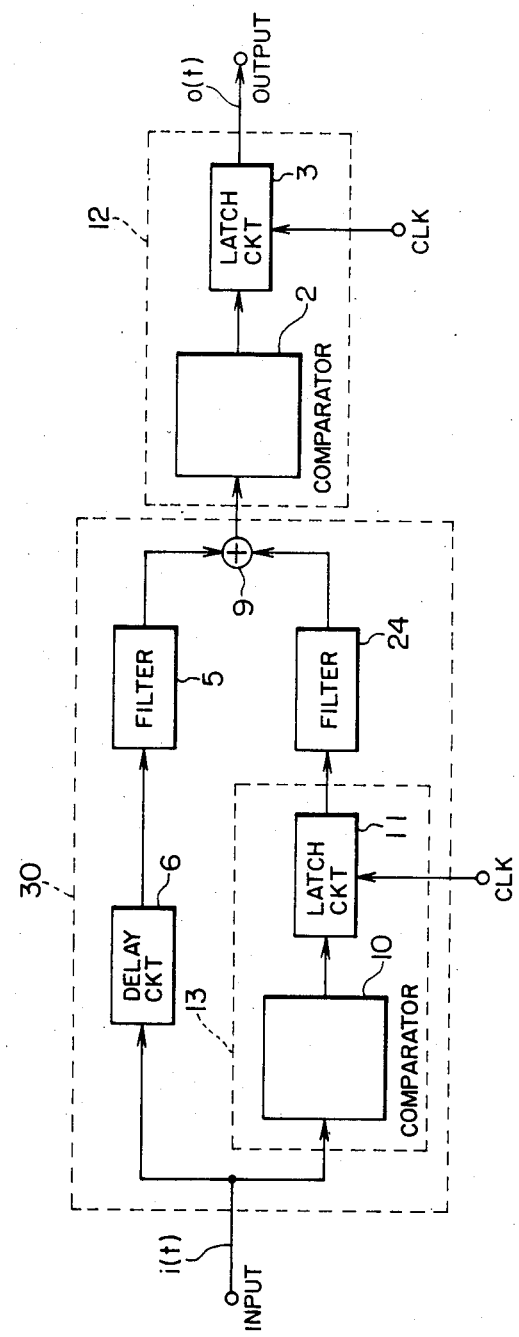
FIGS. 3(a)–(c) are diagrams showing the construction of an apparatus for regenerating original signals according to an embodiment of the present invention.
Figure 3C:
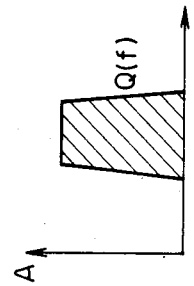

According to the present invention, it was found that the code error which undergoes chain propagation is attributable to the positive feedback loop. Therefore, an open loop is utilized by the present invention. FIG. 3(a) shows the construction in which the open loop is formed most simply, and which compensates the waveform without impairing the regeneration effect of the quantized feedback method. The apparatus consists of a first circuit means 30 and a second circuit means 12.

The first circuit means 30 has a decision circuit 13 which converts the input signal i(t) into a binary signal, a filter 24 having cut-off characteristics similar to those of the aforementioned system 21 that cuts off predetermined frequencies, a delay circuit which delays the input signal i(t) by a time corresponding to the decision circuit 13, a filter 5 having characteristics complementary to the filter 24, and an adder 9. Here, the decision circuit 13 consists of a comparator 10 and a latch circuit 11. The second circuit means 12 which works as a decision circuit consists of a comparator 2 and a latch circuit 3. Clock signals CLK are applied to the two latch circuits 3, 11.

Figure 3B:
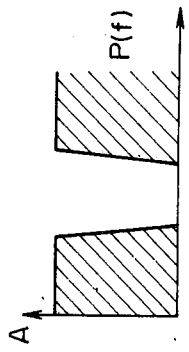

In the first circuit means 30, the input signal i(t) is allowed to pass through two paths. Namely, the signal, on the one hand, passes through the decision circuit 13 consisting of comparator 10 and latch circuit 11, and through the filter 24, and passes, on the other hand, through the delay circuit 6 and the filter 5 having characteristics complementary to the filter 24. Outputs of these two filters 5, 24 are added together in the adder 9. The added output serves as an output signal of the first circuit means 30. The output signal contains noise and is hence converted into a binary signal through the decision circuit that consists of comparator 2 and latch circuit 3, in order to produce a signal 0(t) regenerated from the original signal. For instance, if the recording/regenerating system or the transmission system has such cut-off characteristics P(f) that cut off an intermediate frequency band only as shown in FIG. 3(b), then the filter 24 is constructed to have band-pass characteristics Q(f) shown in FIG. 3(c) to compensate for the above-mentioned characteristics, and the filter 5 is constructed to have characteristics P(f) shown in FIG. 3(b).

It is now presumed that a digital input signal i(t) is input, predetermined frequencies of the digital input signal i(t) being cut off. The decision circuit 13 converts the input signal i(t) into a binary signal "1" or "0". The signal is then sent to the band-pass filter 24 where predetermined frequency components are extracted. The delay circuit 6, on the other hand, delays the input signal i(t) by a time that corresponds to the decision circuit 13. The filter 5 allows the passage of only those frequency components of input signal i(t) that have a correlation to the filter 24. Outputs of the two filters 5, 24 are applied to the adder 9.

Because of the relation $Q(f) + P(f) = 1$, the adder 9 produces a signal similar to the original signal though noise will have been superposed thereon. In order to remove the noise, the signal of the adder 9 is converted into a binary signal "1" or "0" to produce the signal 0(t) that is regenerated from the original signal.

Figure 4:
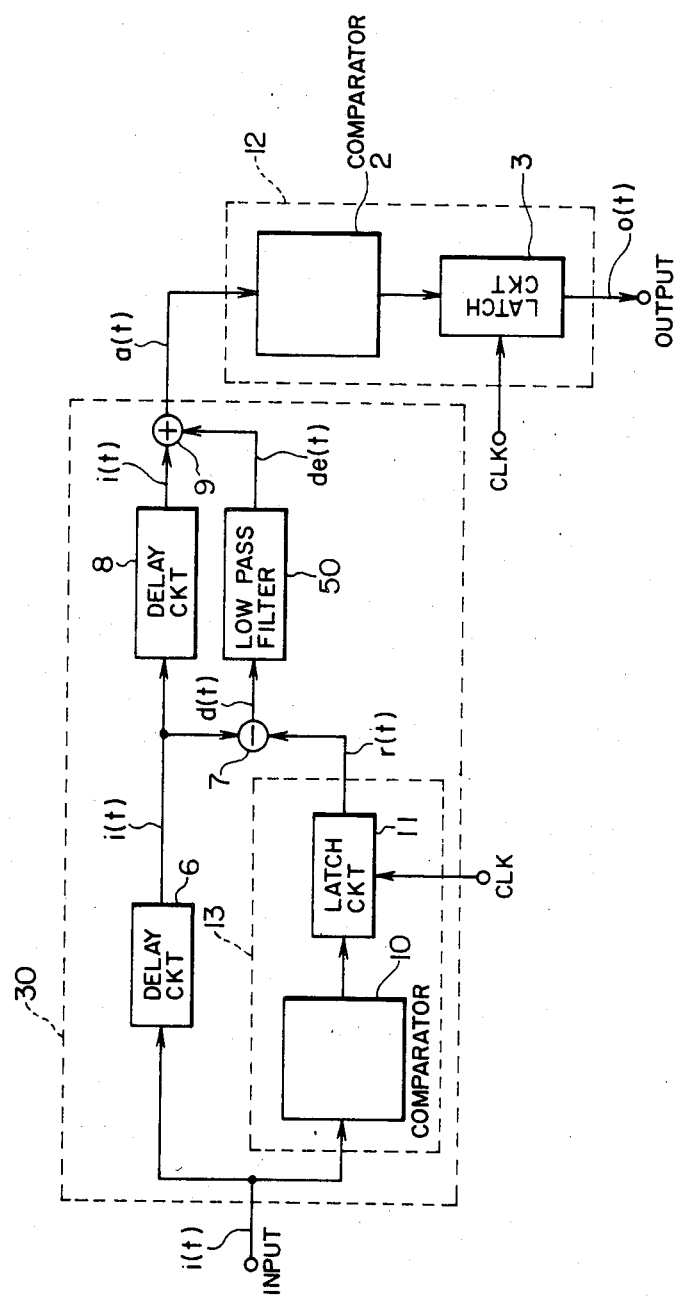
FIG. 4 is a diagram showing the construction of an apparatus for regenerating original signals according to another embodiment of the present invention.

FIG. 4 is a diagram showing the construction of an apparatus for regenerating original signals according to another embodiment of the present invention.

The apparatus consists of a first circuit means 30 and a second circuit means 12 like the apparatus of FIG. 3(a). The first circuit means 30 has a decision circuit 13 which converts the input signal i(t) into a binary signal, a delay circuit 6 which delays the input signal i(t) by a time that corresponds to the decision circuit 13, a subtracter 7 which finds a difference between the output of the decision circuit 13 and the output of the delay circuit 6, a filter 50 having characteristics complementary to those of the system 21 mentioned earlier that cuts off predetermined frequencies, a delay circuit 8 which delays the input signal i(t) for a period of time corresponding to the filter 50, and an adder 9 which adds the output of the filter 50 and the output of the delay circuit 8. Here, the decision circuits 12, 13 are constituted by the comparators 2, 10 and latch circuits 3, 11, respectively, the latch circuits 3, 11 being served with clock signals CLK.

Operation of the apparatus of FIG. 4 will be described below.

The original signal is denoted by g(t) (not shown), a low-frequency signal is denoted by l(t) that is lost in the recording/regenerating system 21, and a remaining high-frequency signal is denoted by h(t). Further, noise generated in the recording/regenerating system 21 is denoted by n(t), and noise generated in the decision circuit 13 is denoted by m(t). The signal produced by the decision circuit 13 is denoted by r(t) and the output of the subtracter 7 is denoted by d(t).

The input signal i(t) is given by the following equation, $$i(t) = g(t) - l(t) + n(t) = h(t) + n(t) \tag{2}$$

Further, if the code error rate in the output of the decision circuit 13 is sufficiently small, the decision circuit 13 regenerates a signal r(t) which is similar to the original signal g(t) and which is given by the following equation, $$r(t) = g(t) + m(t) \tag{3}$$

Here, the noise m(t) results mainly from jitter components contained in the clock signals CLK, and wherein $n(t) >> m(t)$. The delay circuit 6 compensates the delay time generated by the decision circuit 13, and produces the signal i(t). Therefore, a differential signal d(t) of the subtracter 7 is given by, $$\begin{aligned} d(t) &= r(t) - i(t) \\ &= g(t) + m(t) - h(t) - n(t) \\ &= l(t) + m(t) - n(t) \end{aligned} \tag{4}$$

The differential signal d(t) is allowed to pass through the low-pass filter 50. Even when the signal after having been determined contains a code error, the low-pass filter 50 limits the band thereof, so that the code error will not be generated in the final decision circuit 13 which is made up of comparator 10 and latch circuit 11. As will be explained later, the band of the filter 50 should be set to a minimum range that permits the passage of a low-frequency signal l(t). If the signals and noise whose bands are limited by the filter 50 are denoted by de(t), ne(t) and me(t), the output de(t) is given by the following equation, $$de(t) = l(t) + me(t) - ne(t) \quad (5)$$

Further, the delay circuit 8 corrects the delay of low-pass filter 50 and produces the signal i(t). Therefore, the output a(t) of the adder 9 is given by the following equation, $$\begin{aligned} a(t) &= i(t) + de(t) \quad (6) \\ &= \{h(t) + n(t)\} + \{l(t) + me(t) - ne(t)\} \\ &= h(t) + l(t) + me(t) + n(t) - ne(t) \\ &= g(t) + me(t) + nh(t) \\ &\approx g(t) + nh(t) \quad (7) \end{aligned}$$

where $nh(t) = n(t) - ne(t)$ which corresponds to a high-frequency component forming noise in the recording-/regenerating system, and a low-frequency noise component is removed.

As will be obvious from the above equation (7), the adder 9 regenerates the original signal a(t) on which noise is superposed. To remove the noise, the signal a(t) is input to the decision circuit 12 which consists of comparator 2 and latch circuit 3, and is converted into a binary signal, in order to regenerate a signal 0(t) which is the same as the original signal g(t).

The circuit of FIG. 4 does not have a feedback loop, either. Therefore, even if a code error develops in the decision circuit 13, the error is confined in this circuit only but is not propagated.

In practice, a recording/regenerating system such as a VTR or the like has cut-off characteristics P(f) in a range of the high frequencies. Therefore, there do not exist complete characteristics Q(f) that satisfy the conditions of equation (1). Hence, an approximation must be employed. Further, the cut-off characteristics P(f) vary depending upon the characteristics of the apparatus and recording conditions of the tape, and do not necessarily assume constant values. In general, it is quite difficult to change the characteristics Q(f) to cope with the change of characteristics P(f). According to the embodiment of the invention, however, the low-frequency component lost in the recording/regenerating system or in the transmission system, can be automatically found from the output signal r(t) of the decision circuit 13 and the input signal i(t), without at all being affected by the change in the low cut-off frequency characteristics. Thus, the embodiment of the invention eliminates all defects inherent in the quantized feedback method.

Described below is a limit for improving code error caused by the cut off of low frequencies according to the embodiment. This is to find low cut-off frequencies in which code error generated in the decision circuit 13 of FIG. 4 also appears in the decision circuit 12. In general, the limit values of cut-off frequencies are also dependent upon the S/N ratio, and are difficult to delineate precisely.

Here, it is presumed that the S/N ratio is infinite, and random errors develop, each having a length of one bit. In this case, a limit value is represented by a cut-off frequency of the low-pass filter 50 at which a pulse which is generated by the decision circuit 13, which has a time width T and a crest value 1, reaches ½ level which is the decision level of the decision circuit 12 after having passed through the low-pass filter 50. Here, it is presumed as a matter of course, that the low cut-off frequency of the recording/regenerating system or the transmission system is equal to the cut-off frequency of the low-pass filter.

Figure 5A:
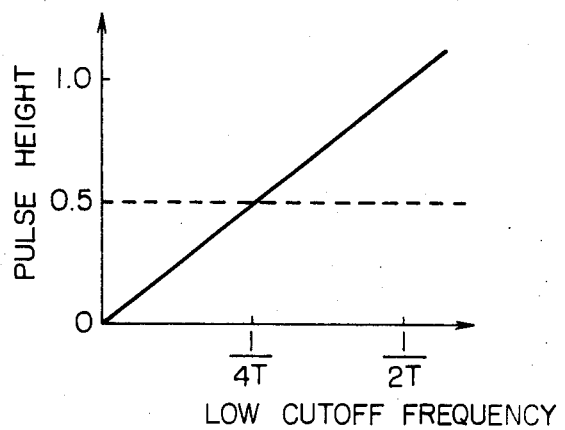
Figure 5B:
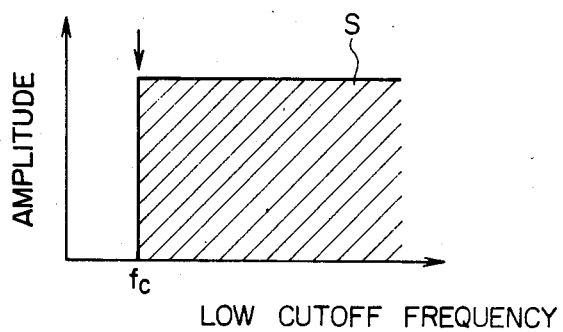

FIG. 5(a) is a diagram showing the change in the crest value of a pulse when the low cut-off frequency is changed, and FIG. 5(b) is a diagram showing the ideal cut-off characteristics.

Here, it is presumed that the ideal cut-off characteristics permit the passage of signal components S that have frequencies greater than the cut-off frequency $f_c$ of the low-pass filter. Under such circumstances, the crest value of pulse becomes one-half at a frequency which is about one-fourth of the bit frequency; i.e., this frequency represents a limit of the low cut-off frequency.

Figure 6:
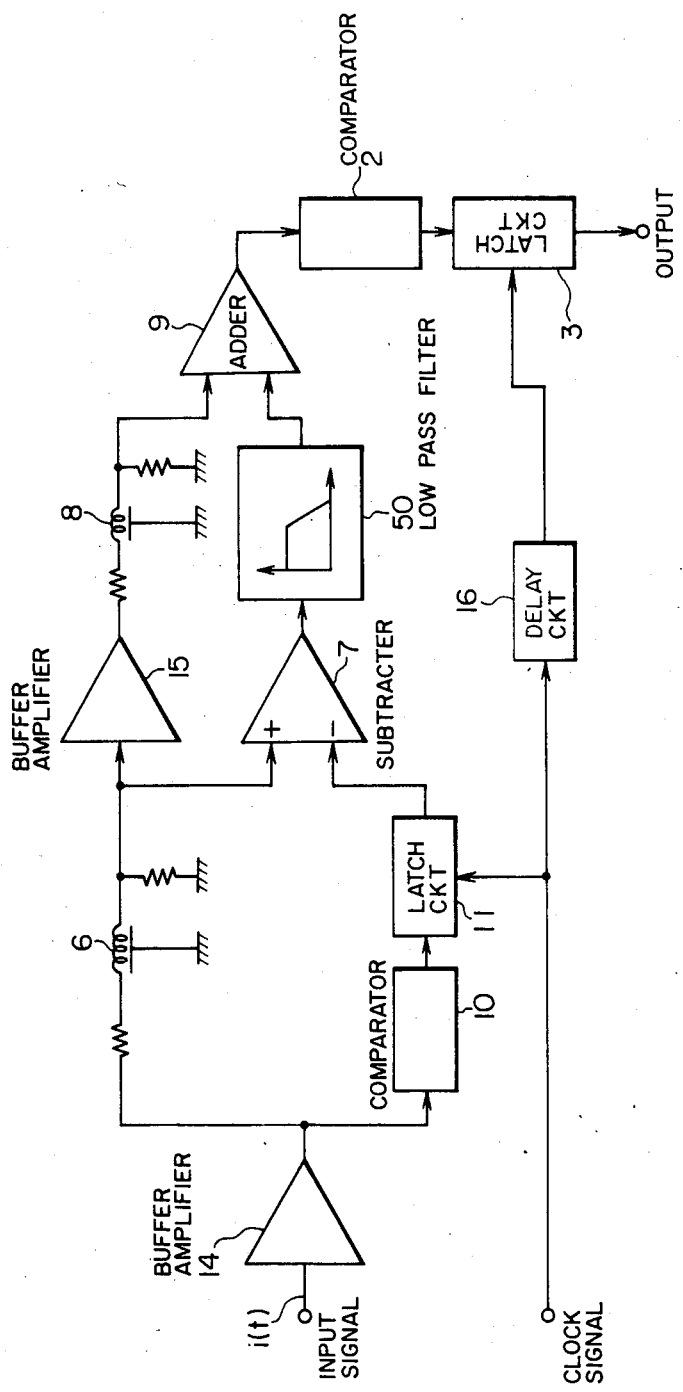
FIG. 6 is a diagram which concretely shows the apparatus of FIG. 4.

FIG. 6 is a diagram which concretely illustrates the circuit of FIG. 4.

Here, the transmission rate of data is assumed to be 50 Mb/s.

The input signal i(t) is input to a buffer amplifier 14, and an output therefrom is divided into two systems. The output on one system is input to a high-speed comparator 10 where it is converted into a binary signal, and is then converted through a latch circuit into a pulse train having a predetermined pulse width of 20 nS. Usually, the comparator 10 has a delay time of 2 to 3 nS, and the latch circuit 11 has a delay time which is one-half the period of 20 nS, i.e., has a delay time of 10 nS. Therefore, the total delay time is about 15 nS. The delay time is absorbed by an analog delay circuit 6 which is constituted by utilizing a coaxial cable. Usually, the coaxial cable has a delay time of about 4 to 5 nS/m. Hence, a coaxial cable which is about 3 meters long may be used. The low-pass filter 50 may be a Gaussian filter having flat group delay characteristics. The delay quantity varies depending upon the cut-off frequency and the degree. For instance, when the cut-off frequency is 10 MHz and the degree is third degree, the delay quantity will be about 100 nS. Therefore, the delay circuit 8 can be constituted by the coaxial cable having a length of 20 meters or more.

Reference numeral 15 denotes a buffer amplifier, 7 denotes a subtracter circuit, and 9 denotes an adder circuit. The operation time of the subtracter circuit 7 is selected to be nearly equal to the delay time of the buffer amplifier 15. The clock signal is applied to the latch circuit 11 and to the latch circuit 3 via delay circuit 16. In this case, the delay circuit 16 for the clock signal should have a variable range of one period, i.e., a variable range of 20 nS, and can be constituted by connecting gate circuits in a plurality of stages or can be constituted by using a delay line.

In the embodiment of FIG. 3, a band-pass filter was used and in the embodiment of FIG. 4, a low-pass filter was used. According to the present invention, a filter should be connected to compensate those portions that are lost in the recording/regenerating system or in the transmission system. Depending upon the cases, therefore, a high-pass filter may be used.

According to the present invention as explained in the foregoing, waveforms that are deteriorated in the recording/regenerating system or in the transmitting system can be compensated to optimum values at all times without affected by the change in characteristics. Moreover, chain phenomenon of code error that developed in the conventional quantized feedback method, is now completely eliminated making it possible to stably regenerate original signals.

We claim:

1. An apparatus for regenerating an original digital signal which is applied to a system which cuts off a predetermined frequency band component in the original digital signal and outputs the remaining signal components, comprising:

first means responsive to the output of said system for generating from said output signal of said system a first signal corresponding to the predetermined frequency band component which has been cut off by said system;

second means responsive to the output of said system for outputting a second signal which is obtained by delaying the output signal of said system by a time that corresponds to the time a signal is delayed by said first means;

third means connected to said first and second means for adding said first and second signals and for outputting a signal representing the addition result thereof; and fourth means connected to said third means for digitizing said output signal of said third means so as to regenerate said original digital signal.

2. An apparatus for regenerating an original digital signal according to claim 1, wherein said first means comprises:

a decision circuit connected to said system for digitizing the output signal of said system and for outputting a digitized signal; and a first filter which has characteristics complementary to the cut off characteristics of said system and which is connected to said decision circuit for generating said first signal from said digitized signal delivered by said decision circuit; and wherein said second means comprises:

a delay circuit connected to said system for delaying the output signal of said system by a time that corresponds to the time a signal is delayed by said decision circuit; and a second filter which has the same cut off characteristics as those of said system and which is connected to said delay circuit for filtering a delayed signal delivered out of said delay circuit and for outputting a filtered signal as said second signal.

3. An apparatus for regenerating an original digital signal according to claim 2, wherein said decision circuit comprises:

comparator means connected to said system for digitizing the output signal of said system; and a latch circuit connected to said comparator means for latching a digitized signal outputted by said comparator means.

4. An apparatus for regenerating an original digital signal according to claim 1, wherein said first means comprises:

a decision circuit connected to said system for digitizing the output signal of said system and for outputting a digitized signal;

a first delay circuit connected to said system for delaying the output signal of said system by a time that corresponds to the time a signal is delayed by said decision circuit and for outputting a delayed signal as a first delayed signal;

a subtractor connected to said decision circuit and to said first delay circuit for outputting a difference signal representing the difference between said digitized signal and said first delayed signal; and a filter which has characteristics complementary to the cut off characteristics of said system and which is connected to said subtractor for generating said first signal from said difference signal and for outputting said first signal; and wherein said second means comprises:

a second delay circuit connected to said system through said first delay circuit for delaying said first delayed signal by a time that corresponds to the time a signal is delayed by said filter and for outputting a delayed signal as said second signal.

5. An apparatus for regenerating an original digital signal according to claim 4, wherein said decision circuit comprises:

a comparator connected to said system for digitizing the output signal of said system; and a latch circuit connected to said comparator, for latching a digitized signal outputted by said comparator.

6. A method of regenerating an original digital signal which is applied to a system which cuts off a predetermined frequency band component in the original digital signal and which outputs the remaining signal components as an output signal, comprising the steps of:

forming said output signal from said system into first and second identical signals;

generating a third signal corresponding to the predetermined frequency band component which is cut off by said system from said first signal outputted from said system;

delaying said second signal outputted from said system by a time that corresponds to the time required to generate said third signal, and outputting a delayed second signal; and adding said third signal and said delayed second signal; and digitizing the result of addition of said third signal and said delayed second signal so as to regenerate said original digital signal.

* * * * *